United States Patent [19]

Kozai et al.

[11] 4,092,176
[45] May 30, 1978

[54] APPARATUS FOR WASHING SEMICONDUCTOR WAFERS

[75] Inventors: Teruo Kozai; Shigeharu Ohara; Hiroshi Suzuki; Shingo Yanagihara, all of Tokyo, Japan

[73] Assignee: Nippon Electric Co., Ltd., Tokyo, Japan

[21] Appl. No.: 748,160

[22] Filed: Dec. 7, 1976

[30] Foreign Application Priority Data

Dec. 11, 1975  Japan .................................. 50-147965

[51] Int. Cl.² .................................................. B08B 3/02
[52] U.S. Cl. .................................. 134/186; 134/25 A; 134/199
[58] Field of Search ....................... 134/186, 198–201, 134/1, 25 A, 190–191, 155, 184

[56] References Cited

U.S. PATENT DOCUMENTS

| | | | |
|---|---|---|---|
| 2,632,452 | 3/1953 | Spitzer | 134/200 X |
| 3,346,000 | 10/1967 | Cushing | 134/186 X |
| 3,373,752 | 3/1968 | Inoue | 134/1 |
| 3,389,712 | 6/1968 | John | 134/198 X |
| 3,594,230 | 7/1971 | Kierner | 134/25 A X |
| 3,893,869 | 7/1975 | Mayer et al. | 134/184 X |
| 3,923,072 | 12/1975 | Beaud | 134/155 X |

FOREIGN PATENT DOCUMENTS

| | | | |
|---|---|---|---|
| 345,260 | 12/1936 | Italy | 134/199 |
| 106,210 | 12/1942 | Sweden | 134/200 |
| 302,188 | 8/1968 | Sweden | 134/186 |

*Primary Examiner*—Robert L. Bleutge
*Attorney, Agent, or Firm*—Hopgood, Calimafde, Kalil, Blaustein & Lieberman

[57] ABSTRACT

An apparatus for washing semiconductor wafers is disclosed which comprises a washing tub, a basket holding semiconductor wafers to be washed and placed in the washing tub, nozzles provided above and below the basket respectively for constantly squirting a washing liquid over the wafers, and a vent provided below the basket for periodically draining the waste liquid.

5 Claims, 5 Drawing Figures

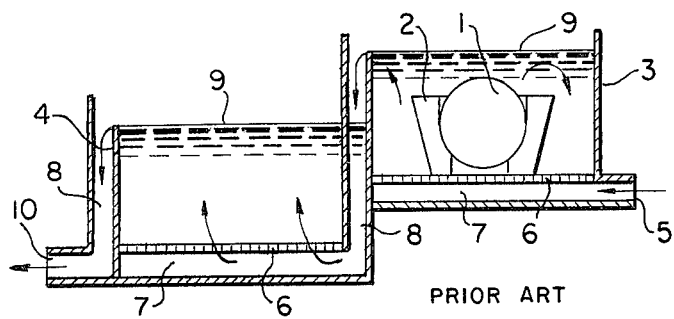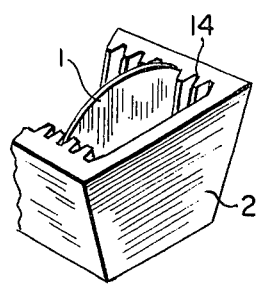
FIG. 1 PRIOR ART
FIG. 2
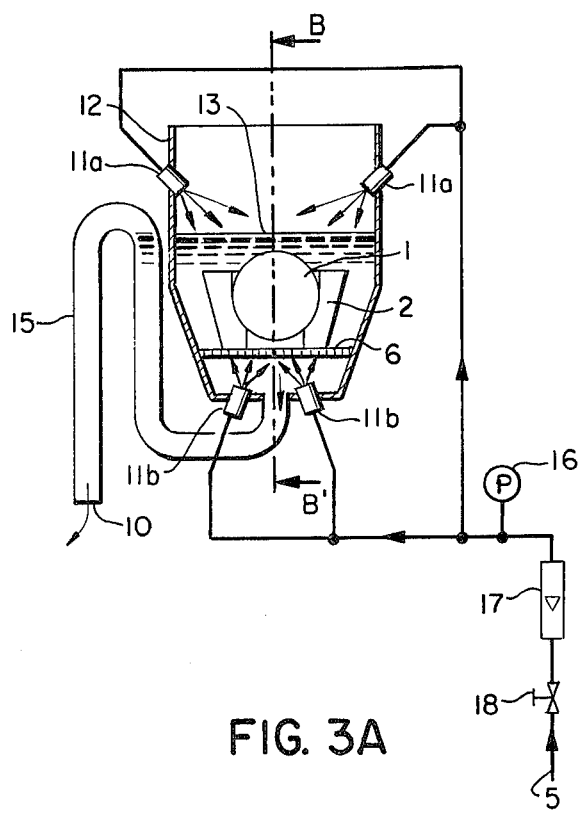
FIG. 3A
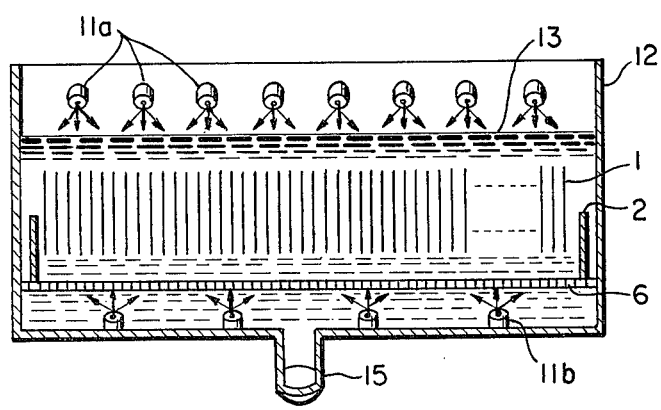
FIG. 3B

APPARATUS FOR WASHING SEMICONDUCTOR WAFERS

BACKGROUND OF THE INVENTION

The present invention relates to an apparatus for washing semiconductor wafers subjected to chemical treatment in the process of fabrication of semiconductor devices.

A cascade-type washing apparatus has been conventionally used for washing semiconductor wafers. This type of apparatus includes a plurality of washing tubs arranged in a cascade, and chemically inert water, namely pure water distilled or treated by ion-exchange, is constantly supplied to the uppermost tub of the apparatus. The pure water that overflows from the uppermost tub is carried down into the succeeding tubs one after another and ultimately into the lowermost tub. With the water run, a basket holding semiconductor wafers is placed first in the lowermost tub and is then transferred to the upper tubs in sequence, and thus the wafers are washed. This type of washing apparatus, however, has many defects in that part of the chemical waste removed from the wafers remains undrained with a certain amount of water stagnating in the tubs, with the result that the wafers are again contaminated by the residue of the waste near the water surface each time they leave the tub. Furthermore, the water flow along the wafers is as slow as several tens of centimeters per second, where substantial washing efficiency can hardly be expected. Stil further, because the wafers are held in parallel in the basket with their edges retained in grooves formed inside the basket, the retained part of the wafer surfaces cannot be washed thoroughly. Further, in the type of apparatus in which the washing water is periodically replaced, the water level recedes along the wafer surfaces, and residual chemical waste and solid particles floating on the surface of the water contaminate the wafers.

It is therefore an object of the present invention to provide a washing apparatus capable of thoroughly washing semiconductor wafers without allowing contaminants to be adhered again to the wafer surfaces.

It is another object of the invention to provide a washing apparatus capable of washing semiconductor wafers in a reduced period of time and with a minimum amount of washing liquid.

A washing apparatus for semiconductor wafers according to the present invention comprises a single washing tub in which semiconductor wafers are placed, means for constantly squirting a washing liquid downward to the wafers, means for constantly squirting a washing liquid upward to the wafers, and means for periodically draining the waste liquid from a position below the wafers.

Further objects, features and advantages of the invention will become more apparent from the following description when read in conjunction with the accompanying drawings, in which:

FIG. 1 is a sectional view showing constructional features of a prior art washing apparatus;

FIG. 2 is a perspective view showing constructional featues of a basket holding wafers;

FIG. 3A is a sectional view showing constructional features of a washing apparatus according to an embodiment of the present invention, while FIG. 3B is a cross-sectional view taken along line B—B' of FIG. 3A.

Figure 4:
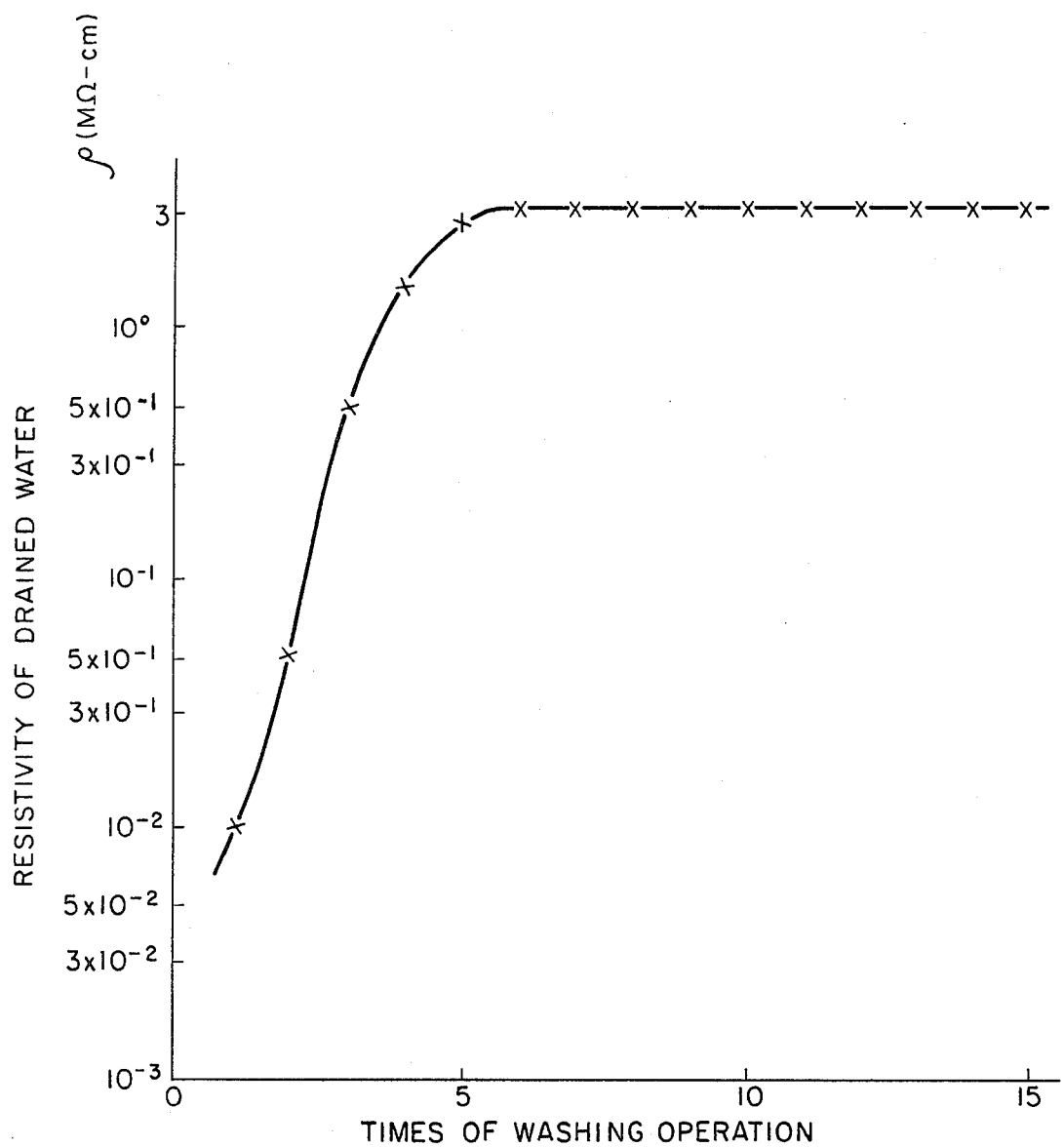
FIG. 4 is a graph indicating the relation between washing times and the resistivity of drained water according to one embodiment of the invention.

With reference to FIG. 1, there is schematically shown a prior art washing apparatus comprising a water supply port 5, tubs 3 and 4, a basket 2 holding semiconductor wafers 1 therein, water passages 7 and 8, perforated plates 6 on which the basket 2 is placed and through which the washing water passes, and a drain port 10. The arrows in FIG. 1 show the directions of flow of the washing water. In the operation of this apparatus, pure water is supplied to the upper tub 3 by way of the supply port 5, passage 7, and perforated plate 6. The overflowed water enters the lower tub 4 by way of the passages 8 and 7, and perforated plate 6. The overflowed water is then drained from the port 10. In this type of washing apparatus, a plurality of tubs are installed in a cascade, and the basket 2 holding semiconductor wafers 1, which have been subjected to chemical treatment, is placed first in the lowermost tub 4 in which they are washed by the flow of the washing water. After a given period of time, the basket 2 is transferred to the upper tub 3, in which they are washed again. More specifically, chemical waste and solid particles are removed from the wafer surfaces by pure water flowing upward from the bottom of the basket. The waste and solid particles are drained down the lower tubs. In practice, however, not all the waste and solid particles are drained but a considerable amount of them remain with circulated or stagnant water in the tubs. In experiments, it took about 15 minutes for the waste and solid particle to be completely removed from a tub 150 mm long, 150 mm wide, and 100 mm high, with pure water supplied at a flow rate of about 300 liters/hour. However, the chemical treatment agent and other contaminants once removed from the wafers and the basket may again again attached to the wafers and the basket. Moreover, the chemical treatment agent and contaminants are floated on the water surface by the circulating flow and are readily attached to the washed wafers and the basket when the basket is taken up from the tub. In view of washing efficiency, it is desirable that fresh water always flows along the surface of the wafers at a high flow rate. However, in the prior art apparatus, the cross-sectional area of the tub in the direction perpendicular to water flow is large and hence a large quantity of water supply is needed to obtain a greater flow rate. Moreover, the basket 2 normally has grooves 14 each being 3 to 5 mm deep for retaining wafers 1 separately, as shown in FIG. 2. In practice, it has been impossible to thoroughly wash the wafer edges retained in the grooves when water is supplied at a commonly applied flow rate of about 10 cm/sec.

FIGS. 3A and 3B illustrate a washing apparatus according to one embodiment of the invention; like constituent elements in FIGS. 3A and 3B are indicated by the identical reference numerals as in FIGS. 1 and 2. As shown in FIGS. 3A and 3B, the washing apparatus comprises a single tub 12 made of 4 mm thick transparent plate of polyvinyliden chloride, with an upper width of 140 mm, a bottom width of 70 mm, a height of 160 mm, and a length of 220 mm, in which a perforated plate 6 of 75 mm in width and 212 mm in length is fixed. A basket 2 made of polyvinyliden chloride, of 70 mm in maximum width and 50 mm in height, and 190 mm in length, holding therein 50 sheets of silicon wafers, to be washed, and 60 mm in diameter, is placed on the perforated plate 6. The tub 12 is provided with nozzles 11a which are fixed on the opposing longer walls in line. In this embodiment, eight nozzles are fixed on each longer wall with a 25 mm distance between the centers of the adjacent nozzles. These nozzles are positioned above the basket 2 so that water from them is squirted downward to the wafers 1. Other nozzles 11b are fixed on the bottom of the basket 2 in two rows, four nozzles for each row, with a 50 mm distance between the centers of adjacent nozzles, so that washing water is squirted therefrom through the perforated plate 6 upward to the wafers 1. A siphon type of drain tubs 15 made of transparent polyvinyliden chloride tube, 20 mm in inner diameter, is attached to the bottom of the tub 12. This drain tube 15 is bent from a position below the bottom of the tub 12 upward and is further bent downward at a position above the semiconductor wafers 1 so as to automatically drain water from the tub 12 by resorting to the siphon phenomenon. The apparatus further comprises a water supplying system for nozzles 11a and 11b including a port 5, a throttle valve 18, a flow meter 17 and a pressure meter 16. In this apparatus, at first pure water obtained through filtration and ion-exchange is supplied through the port 5, the throttle valve 18, the flow meter 17, and the pressure meter 16 to the nozzles 11a and 11b. From the upper nozzles 11a, the pure water is squirted over the wafers 1 in the basket 2. The nozzle 11a and 11b are provided above and below the basket 2 respectively, because if they are provided only above the basket 2, the wafers 1 which are loosely retained in the individual grooves 14 will become tilted and will come in contact with each other by the pressure of the squirted water. The lower nozzles 11b can direct water toward narrow spaces between the wafers which are tilted under the pressure of water squirted from the upper nozzles 11a, thereby preventing the wafers 1 from contacting each other. The water squirted from the nozzles 11a and 11b is stored in the tub 12 to a level 13 where the basket 2 is submerged. As a result, the wafers 1 are well separated from each other and the wafer surfaces are exposed to streams of water squirted from the upper and lower nozzles 11a and 11b, whereby the wafers are washed thoroughly. Chemical waste and other contaminants removed from the wafers 1 are drained together with the stored water by way of a drain tube 15. This drain is done automatically by virtue of the siphon phenomenon when the level of the stored water reaches the point at which the drain tube 15 is bent downward. While the waste water is being drained, pure water is constantly squirted over the wafers 1 and basket 2 from the nozzles 11a, 11b, thereby preventing chemical waste and other contaminants from being adhered again to the surfaces of the wafers and the basket. When the waste water is all drained, air is spontaneously admitted into the drain tube 15 to allow the squirted water to be stored in the tub 12. The water level rises quickly because the capacity of the tub 12 is minimized. The waste water is drained automatically at regular time intervals which depend on the flow rate of the water supply.

An example of experiments made by use of the washing apparatus of FIGS. 3A and 3B is now described. Fifty sheets of silicon wafers of 60 mm in diameter, which had been subjected to the usual etching process of silicon dioxide by using a buffered etching solution, were disposed in the basket 2 which was then placed in the tub 12. Then, pure water having an electrical resistivity of 3.1 M$\phi$-cm and kept at a temperature of 25° C was supplied to the port 5 at a flow rate of 4 liters per minutes and at a water pressure of 2 Kg. cm$^{-2}$. Under this condition, a time period of one washing operation, that is, a time period from the commencement of storing of squirted water to the end of draining of waste water, was 25 seconds. This washing operation was carried out 15 times in succession.

The effect of the washing operation is indicated in FIG. 4 by using the change in electrical resistivity of the drained water from the apparatus. In general, the electrical resistivity of water indicates the grade of purity of the water. Therefore, if the value of the electrical resistivity of the drained water is equal to that of the water supplied to the port 5 (3.1 M$\phi$-cm in this case), it means that washing of the wafers is completely accomplished. Thus, a change in the electrical resistivity of the drained water indicates the progress of washing of the wafers. According to FIG. 4, the value of electrical resistivity of the drained water reaches that of the supplied water (3.1 M$\phi$-cm) by six washing operations or after about 3 minutes from the commencement of washing. Therefore, washing of the wafers can be accomplished in only 3 minutes in the washing apparatus according to this invention. In the apparatus of the invention, the velocity of flow of pure water along the wafer surfaces and basket surfaces is about 50 times as great as that available with the prior art apparatus. Further, in the apparatus of the invention, the wafer edges retained in the grooves 14 of the basket 2 can be thoroughly washed by pure water constantly squirted from the nozzles 11a and 11b all while the water level in the tub 12 is rising and falling. Because the water in the tub is periodically drained and pure water is constantly squirted, it is impossible for chemical waste and other contaminants to adhere to the wafer surfaces and basket. In conclusion, with the washing apparatus of the invention, the washing efficiency is increased, while the washing time is reduced and the amount of pure water used is minimized. If necessary, by applying ultrasonic vibration to the wafers to be washed, the efficiency of washing operation can be further increased.

We claim:

1. A washing apparatus comprising a tub in which a basket setting wafers to be washed is placed, a plurality of nozzles provided above and below the semiconductor wafers for squirting pure water to the semi-conductor wafers and for retaining loosely the semiconductor wafers in said basket by the squirted pure water continuously during a washing operation, a vent provided below the semi-conductor wafers, means for storing the water squirted from said nozzles in said tub to submerge the semiconductor wafers therein, and means for periodically draining the stored water from said tub through said vent when the surface of the stored water reaches a level above the semiconductor wafers.

2. A washing apparatus according to claim 1 further comprising a basket for holding the wafers separately from each other which is placed in the tub.

3. A washing apparatus according to claim 2, in which said vent includes a draining tube extending upward from the bottom of said tub and bending downward at a point higher than the wafers.

4. A washing apparatus according to claim 3, in which said tub is made of a transparent plastic material.

5. An apparatus for washing semiconductor wafers, comprising a tub, means for holding semi-conductor wafers to be washed in said tub separately from the bottom of said tub, first means coupled with said tub for squirting a washing liquid downward to the semiconductor wafers and for holding loosely the semiconductor wafers by the squirted washing liquid in said tub continuously during a washing operation, second means coupled with said tub for squirting a washing liquid upward to the semiconductor wafers and for holding loosely the semiconductor wafers by the squirted washing liquid in said tub continuously during a washing operation, means for storing the washing liquid squirted from said first and second squirting means to submerge the semiconductor wafers, and means coupled with the bottom of said tub for automatically draining the stored liquid from the bottom of said tub when the washing liquid is stored to a specific surface level.

* * * * *